(12) United States Patent
Stolk

(10) Patent No.: US 6,982,212 B2
(45) Date of Patent: Jan. 3, 2006

(54) METHOD OF MANUFACTURING A SEMICONDUCTOR DEVICE

(75) Inventor: Peter Adriaan Stolk, Leuven (BE)

(73) Assignee: Koninklijke Philips Electronics N.V., Eindhoven (NL)

( * ) Notice: Subject to any disclaimer, the term of this patent is extended or adjusted under 35 U.S.C. 154(b) by 59 days.

(21) Appl. No.: 10/497,263

(22) PCT Filed: Nov. 20, 2002

(86) PCT No.: PCT/IB02/04881

§ 371 (c)(1), (2), (4) Date: May 27, 2004

(87) PCT Pub. No.: WO03/046967

PCT Pub. Date: Jun. 5, 2003

(65) Prior Publication Data
US 2005/0003638 A1 Jan. 6, 2005

(30) Foreign Application Priority Data
Nov. 30, 2001 (EP) ................... 01204625

(51) Int. Cl.
H01L 21/20 (2006.01)
H01L 21/36 (2006.01)

(52) U.S. Cl. ............. 438/482; 438/481; 438/486; 438/487; 438/488; 438/489; 438/495; 438/499

(58) Field of Classification Search ............ 438/481, 438/482, 486, 487, 488, 489, 495, 499
See application file for complete search history.

(56) References Cited

U.S. PATENT DOCUMENTS

| 4,535,220 A | 8/1985 | Cullis et al. |
| 5,950,078 A * | 9/1999 | Maekawa et al. ......... 438/149 |
| 5,953,615 A | 9/1999 | Yu |
| 6,777,317 B2 * | 8/2004 | Seibel et al. ............. 438/486 |

OTHER PUBLICATIONS

Patent Abstracts of Japan vol. 014, No. 012 (E-971) Jan. 11, 1990 & JP 01 256124 (Ricoh Co Ltd), Oct. 12, 1989: Abstract.

* cited by examiner

*Primary Examiner*—David Nelms
*Assistant Examiner*—Renee R. Berry
(74) *Attorney, Agent, or Firm*—Peter Zawilski

(57) ABSTRACT

In the method of manufacturing a semiconductor device (1) with a semiconductor body (2), a doped zone (3) is formed in the semiconductor body (2). The semiconductor body (2) has a crystalline surface region (4), which crystalline surface region (4) is at least partly amorphized so as to form an amorphous surface layer (5). The amorphization is achieved by irradiating the surface (6) with a radiation pulse (7) which is absorbed by the crystalline surface region (4). The radiation pulse (7) has a wavelength which is chosen such that the radiation is absorbed by the crystalline surface region (4), and the energy flux of the radiation pulse (7) is chosen such that the crystalline surface layer (5) is melted. The method is useful for making ultra-shallow junctions.

12 Claims, 3 Drawing Sheets

METHOD OF MANUFACTURING A SEMICONDUCTOR DEVICE

The invention relates to a method of manufacturing a semiconductor device with a semiconductor body, in which method a doped region is formed in the semiconductor body, which semiconductor body comprises a crystalline semiconducting surface region of semiconductor material, while at least a portion of said crystalline semiconducting surface region is amorphized so as to form an amorphous surface layer.

U.S. Pat. No. 5,908,307 discloses a method in which source and drain junctions of a MOSFET are manufactured. The source and drain junctions are manufactured in an Si semiconductor body and are very shallow, typically less than 100 nm deep. Shallow junctions are manufactured through amorphization of the surface, the provision of dopant atoms, and activation and diffusion of the dopant atoms. An amorphous surface layer is formed for preventing channeling during implantation of the dopant atoms. In the amorphization step, the desired depth of the amorphous surface layer is adjusted through ion implantation of an electrically inert ion such as argon, silicon, or germanium. The crystalline semiconducting surface layer is amorphized as a result of collisions of the ions and energy dissipation, and an amorphous surface area is formed. Since Ge is a comparatively heavy atom, abrupt amorphous-crystalline interfaces can be manufactured in this manner. Seen from the surface, damage will be present deeper down in the crystalline semiconductor body below the amorphous surface layer, the so-called end-of-range damage.

A problem of the known method is that interstitials and vacancies arise in the amorphization step owing to the implantation of ionized inert atoms. The interstitials present at the amorphous-crystalline interface cause an increased diffusion of dopant atoms, especially of B and P. This transient-enhanced diffusion renders steep doping profiles practically impossible. In addition, the end-of-range damage causes dislocation loops during annealing, which give rise to junction leakage.

It is an object of the invention to provide a method of manufacturing the semiconductor device of the kind mentioned in the opening paragraph whereby an amorphous surface layer is obtained substantially without damage in the semiconductor body.

This object is achieved in the method according to the invention in that the amorphization is carried out through irradiation of the surface with a radiation pulse which is absorbed by the surface region, which has a wavelength which is chosen such that the radiation is absorbed by the crystalline surface region, and whose energy flux is chosen such that the crystalline surface layer is melted thereby.

The energy of the photons of the radiation pulse is transmitted substantially instantaneously to the crystal lattice after the photons have been absorbed, with the result that the surface layer is indeed melted, but no thermal equilibrium has yet established itself. The molten surface layer is in direct contact with a comparatively cold semiconductor body. This induces a strong heat flux to the semiconductor body, so that the molten semiconductor material cools down very quickly. It is essential for the molten semiconductor material to cool down to below the equilibrium melting point value of the amorphous semiconductor material at a rate faster than the rate at which recrystalization occurs at the interface between the semiconductor body and the molten semiconductor material. The supercooled semiconductor material turns into amorphous material before the semiconductor material can grow epitaxially from the semiconductor body in the direction of the surface. An amorphous surface layer is created thereby.

No interstitials or vacancies are present at the amorphous-crystalline interface, in contrast to the known method. There is no end-of-range damage in the crystalline semiconductor such as is caused by amorphization by implantation. The absence of damage of any kind renders it possible to form doped zones with steep profiles such as, for example, pn or np junctions.

Dopant atoms will usually be provided in the amorphized surface layer after this. The dopant atoms may be provided, for example, by ion implantation or by diffusion from an auxiliary layer on the surface. If ion implantation is used, the implantation dose determines the number of dopant atoms per $cm^2$, and the energy determines the depth of the implanted dopant atoms. It is important for the implantation depth of the dopant atoms to lie in the amorphized surface layer. Damage caused by the implantation, such as interstitials, vacancies, and clusters of such defects, will not lie in the crystalline semiconductor body as in the known method, but are trapped in the amorphized surface layer. The amorphous surface layer absorbs as it were the implantation damage.

Subsequently, at least a portion of the amorphized surface layer is heated to a temperature at which the dopant atoms are activated.

There are basically two methods by which this can be achieved: by solid phase epitaxy (SPE) below the melting temperature, or by liquid phase epitaxy (LPE) above the melting point. In either case there will be no implantation-related damage in the silicon, so that shallower junctions can be formed with reduced junction leaks.

Preferably, solid phase epitaxy is used for activating the dopant atoms. Epitaxial recrystallization of the amorphous surface layer from the solid phase can be induced through heating of the semiconductor material to below the melting point by means of, for example, furnace heating, rapid thermal annealing (RTA), or irradiation of the surface with a laser. The minimum temperature required for epitaxial recrystallization is approximately 550° C. for amorphous Si. Implanted dopant atoms are substitutionally incorporated during this recrystallization step, whereby activation takes place. The diffusion of the dopant atoms may be limited through the use of low crystallization temperatures. Since solid phase epitaxy is a non-equilibrium process, it is also possible to pass the solubility limit. Shallow, strongly activated junctions may be made in this manner.

Alternatively, liquid phase epitaxy may be used for activating the dopant atoms. In view of the fact that the amorphous semiconductor material has a lower melting point, the amorphous surface layer can be melted without melting the subjacent semiconductor material of the semiconductor body. The dopant atoms diffuse into the molten surface layer during this step. Since the diffusion coefficient of dopant atoms in the liquid phase is greater than that in the solid phase by many orders of magnitude, the dopant atoms will be redistributed substantially uniformly within the molten depth, whereby an abrupt junction is formed. Cooling down then takes place to a temperature at which the amorphous surface layer recrystallizes. This is possible because the molten semiconductor material recrystallizes in a direction away from the subjacent semiconductor body.

Since the amorphous surface layer has absorbed the implantation damage, there is no transient-enhanced diffusion, and dislocation loops or other agglomerations of defects arising at high temperatures owing to the end-ofrange damage are absent. A junction is formed with steep doping profiles. Junction leakage has been strongly reduced by the absence of dislocation loops in the depletion region of the junction.

Preferably, the crystalline surface layer is amorphized through irradiation with an excimer laser providing a short laser pulse of, for example, 1 ns or shorter. Lasers with short wavelengths, such as a KrF excimer laser with a wavelength of 248 nm, or an ArF excimer laser with a wavelength of 193 nm, have a comparatively small absorption length, so that they are highly suitable for uniform heating of a surface layer, especially at high powers.

The use of a laser pulse of typically 1 ns or shorter means that the surface layer is indeed melted, but a thermal equilibrium has not yet established itself. The molten surface layer is in direct contact with a comparatively cold semiconductor body. This causes a strong heat flux towards the semiconductor body, whereby the molten semiconductor material becomes supercooled. The viscosity of the liquid semiconductor material rises strongly owing to the strong cooling down. The absence of nucleation sites in the liquid phase transforms the supercooled semiconductor material into amorphous semiconductor material when the temperature falls to below the glass temperature of the amorphous semiconductor material.

The amorphous surface layer can be formed in a controlled manner to a depth of approximately ten to a few times ten nanometers, depending on the laser energy density and pulse duration. The depth of the layer amorphized by the laser determines the eventual junction depth to a high degree. The choice of the laser energy density and the pulse duration for the amorphizing step are accordingly determining factors for the depth of the pn junction which can be formed in this procedure.

Since the melting dynamics are dependent on the absorbed energy and not on the incident energy, it is advantageous to reduce strongly any reflections at the surface, which are caused inter alia by topography differences or by changes in roughness of the surface during melting, by means of an absorption layer. It is advantageous to provide an absorption layer for the relevant wavelength of the laser light so as to achieve a uniform absorption of the laser light and a uniform heat transfer at the area of inter alia the pn junction. The absorption layer may be patterned so as to provide a possibility of local heating. The radiation is absorbed better in the location where the pattern is provided, so that the temperature of the surface layer rises locally.

The semiconductor body usually comprises semiconductor devices, such as MOSFET transistors, bipolar transistors, or diodes. The semiconductor devices will usually be isolated during the manufacture of a semiconductor circuit, so that differences in topography are present.

The semiconductor device may be, for example, an integrated circuit (IC) with logic, a memory, or optical components. The IC may be used, for example, in mobile telephones, telecommunication networks, or a personal computer.

These and other aspects of the device according to the invention will be described in more detail with reference to the drawings, in which:

FIG. 1 shows a sequence of steps in the method of manufacturing the semiconductor device, FIGS. 1a to 1c showing cross-sections of the intermediate products;

FIG. 2 shows a sequence of steps in the method of manufacturing the source and drain junctions in a MOSFET:

FIG. 3 shows a sequence of steps in the method of manufacturing the source and drain extensions in a MOSFET:

Figure 1A:
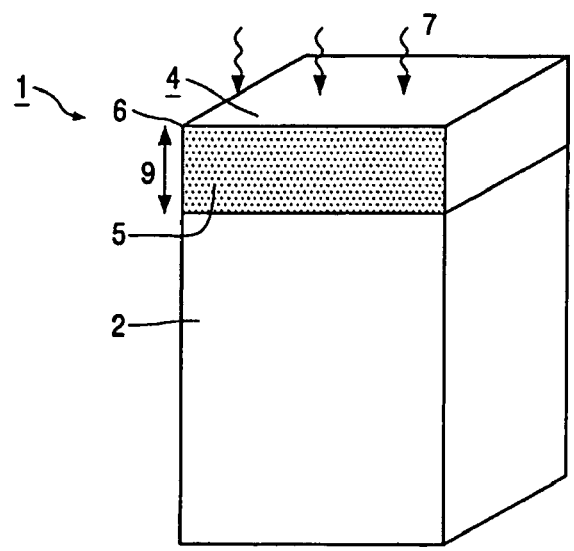
FIG. 1a is a cross-sectional view of the intermediate product after amorphization of the surface layer.

In the method of manufacturing a semiconductor device 1 with a semiconductor body 2 as shown in FIG. 1, a doped region 3 is formed in the semiconductor body 2. The semiconductor body 2 comprises a crystalline semiconducting surface region 4 of semiconductor material. At least a portion of the crystalline semiconducting surface region 4 is amorphized so as to form an amorphous surface layer 5. The semiconductor material of the semiconductor body 2 may be, for example, Si, Ge, or a compound of Si and Ge. The semiconductor body may alternatively be a silicon-on-insulator (SOI) wafer, or a layer of semiconductor material provided on a substrate of, for example, ceramic material or glass.

FIG. 1a starts with a crystalline surface layer 5 of semiconductor material, which crystalline surface layer 5 is amorphized so as to form an amorphous surface layer 5. The amorphization is carried out through irradiation of the surface 6 with a radiation pulse which is absorbed by the surface region 4, which radiation has a wavelength chosen such that the radiation is absorbed by the crystalline surface region 4, while its energy flux is chosen such that the crystalline surface layer 5 is melted thereby.

In the embodiment shown, the surface of an Si semiconductor body 2 is irradiated with a radiation pulse 7 having a wavelength of 248 nm from a KrF excimer laser. The crystalline silicon surface 6 is irradiated for 15 ps with an energy density of 100 mJ/cm$^2$. The crystalline Si is melted over a depth 9 of approximately 30 nm. The short pulse duration means that the semiconductor body 2 is substantially not heated, and the heat flux to the semiconductor body 2 is typically higher than $10^{10}$ K/s. The heat flux is quickly discharged, inter alia because of the comparatively high coefficient of thermal conduction of Si. An amorphous upper layer 5 is formed because the amorphization rates in Si are typically much higher than 15 m/s and the epitaxial recrystallization rate is only of the order of 5 to 15 m/s. The depth 9 of the amorphous Si surface layer 5 in the embodiment shown is approximately 30 nm.

Figure 1B:
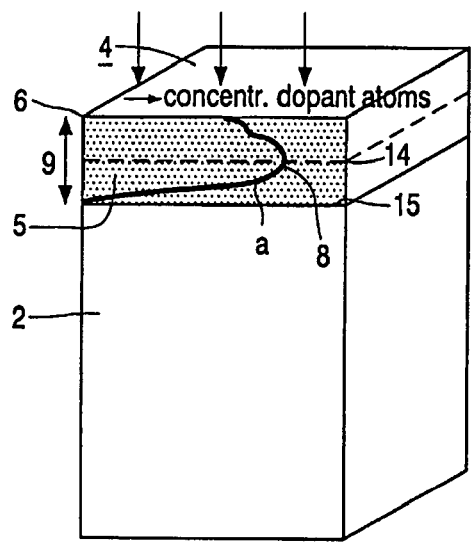
FIG. 1b is a cross-sectional view of the intermediate product after implantation of dopant atoms into the amorphous surface layer.

A doped zone 3 is subsequently formed in FIG. 1b through implantation of dopant ions 8. The dopant ions 8 may be, for example, As, P, Sb, B, or In. The projected range 14 of the dopant ions lies in the amorphous surface layer 5 during the implantation. The implantation damage is absorbed in the amorphous surface layer 5 owing to the fact that the implantation takes place in this amorphous surface layer 5, so that the amorphous-crystalline interface 15 remains free from damage.

In the embodiment shown, B ions are implanted with an energy of 1 keV and an implantation dose of $1\times10^{15}$ at/cm$^2$. The projected range 14 of the implanted ions is typically smaller than 25 nm in the embodiment shown for the following energy levels: 0.5 keV B, 2 to 5 keV As, 1 keV P, 5 to 10 keV Sb, while the implantation dose is typically chosen to be between $3\times10^{14}$ and $3\times10^{15}$ at/cm$^2$. Curve a in FIG. 1b represents the implanted doping concentration as a function of the depth 9 in the amorphous surface layer 5.

Figure 1C:
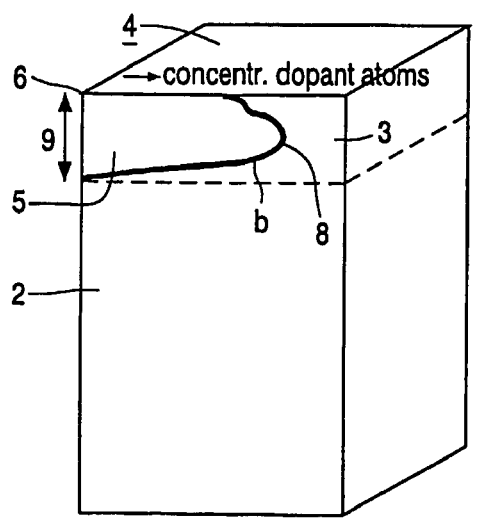
FIG. 1c is a cross-sectional view of the intermediate product after activation and diffusion of the dopant atoms.

In FIG. 1c, the doping atoms 8 are activated in a rapid thermal annealing process in the embodiment shown. The semiconductor body 2 is very quickly heated in an RTA by a so-termed spike anneal, and is cooled down again substantially immediately afterwards. In the embodiment shown, the B atoms are heated at 1000° C. for approximately 1 second, and immediately cooled down again. The concentration profile of the dopant atoms after heating remains substantially identical to the implanted doping profile thanks to the absence of damage, as is shown by curve B. There is accordingly substantially no diffusion owing to the absence of damage. During cooling down, the Si recrystallizes from the amorphous-crystalline interface 5 in the direction of the surface 6, and B atoms are incorporated substitutionally in the lattice sites in the Si. A very shallow doped p-type region 3 is formed with a depth 9 of approximately 30 nm.

Alternatively, the B doping may be activated by a laser anneal for 30 ns at 500 mJ/cm$^2$ with a 248 nm KrF laser. The comparatively high energy flux and the comparatively long pulse duration cause the amorphized surface layer 5 to melt. The diffusion coefficient of the dopant atoms in the liquid phase is greater by several orders of magnitude than in the solid phase. Thus, for example, the diffusion coefficient of B in Si is greater in the liquid phase than in the solid phase by approximately 8 orders of magnitude. The distribution of the dopant atoms 8 is substantially uniform throughout the molten surface layer 5 in this case. Since the heat cannot be removed quickly enough, recrystallization occurs after melting, starting from the amorphous-crystalline interface 15 in the direction of the surface 6 of the semiconductor body 2.

The dopant atoms 8 are substitutionally incorporated in the lattice sites during recrystallization, so that they become electrically active. Given the above pulse duration and energy flux, the p-type junction has a depth 9 of approximately 30 nm with an extreme steepness of approximately 0.2 nm per decade. The comparatively very low sheet resistance of 200 ohms/square indicates that practically all B atoms are present substitutional into the Si lattice and are accordingly electrically active. The junction thus obtained is extremely shallow with a high electrical activation and a low sheet resistance.

In the embodiment shown in FIG. 2, the semiconductor device is a MOSFET 11. The method starts with a Si semiconductor body 2 which is provided with an n-well 16, isolation 17, a gate dielectric 25, and a gate 18, for example made of polysilicon, all formed in a manner known to those skilled in the art.

An absorption layer 10 for the radiation is provided at the surface 6 of the semiconductor body 2 with the gate 18. The absorption layer 10 for the laser radiation of 248 nm is formed by 12 nm TEOS and a multilayer of 20 nm Ti/TiN in this embodiment. The surface is subsequently irradiated with a radiation pulse 7.

Figure 2A:
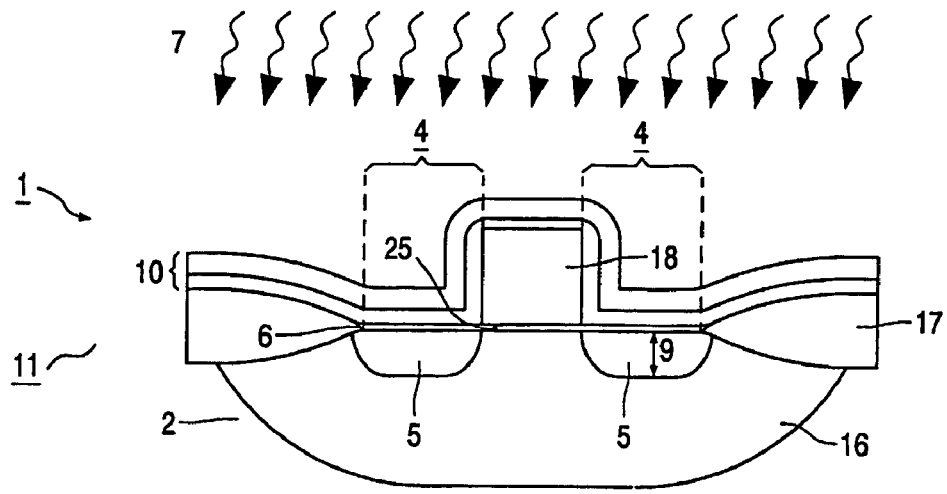
FIG. 2a is a cross-sectional view of the intermediate product in which the gate, source, and drain junctions are covered by an absorption layer.

In the embodiment shown in FIG. 2a, the surface is irradiated for 15 ps with an energy density of 50 mJ/cm$^2$ by means of a 248 nm KrF excimer laser. The source 12 and drain 13 regions are amorphized thereby to a depth 9 of 15 nm.

Figure 2B:
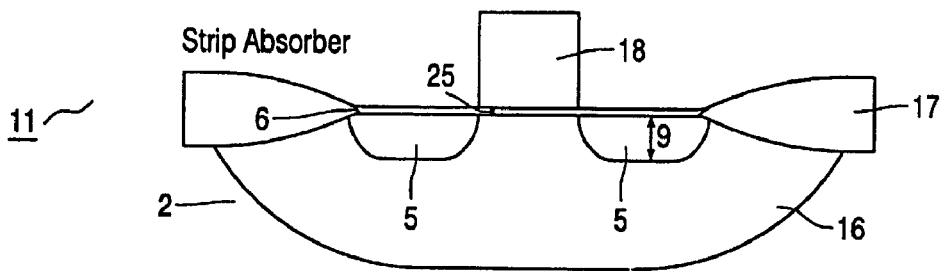
FIG. 2b is a cross-sectional view of the intermediate product in which the source and drain junctions are amorphized by a laser pulse.

In FIG. 2b, the Ti/TiN multilayer is subsequently removed. The Ti/TiN multilayer is removed, for example, by chemical etching in a solution comprising fluorine, or by reactive ion etching in a plasma of, for example, He/SF$_6$.

It is important that the absorption layer 10 should be removed so as to prevent metal atoms from entering the semiconductor body 2 during the implantation.

Figure 2C:
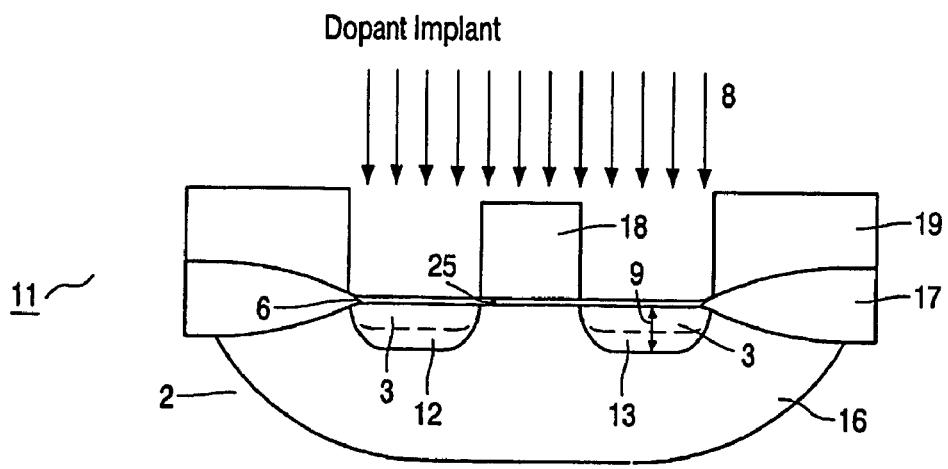
FIG. 2c is a cross-sectional view of the intermediate product in which the source and drain junctions are implanted into the amorphous surface layer.

In FIG. 2c, subsequently, the dopant atoms 8 are provided in the amorphous surface layer 5. In the embodiment shown, B ions are implanted into the amorphous surface layer 5 at an energy of 0.5 keV with a dose of $1\times10^{15}$ at/cm$^2$. An implantation mask 19, for example a resist, is used for implanting the B atoms only in the source 12 and drain 13 regions of the relevant p-type transistor. After the implantation the resist mask 19 is removed. The dopant atoms are activated in a rapid thermal annealing (RTA) process.

The semiconductor body 2 is heated very quickly by means of a so-termed spike anneal in an RTA and is cooled down again substantially immediately after this. In the embodiment shown, the B atoms are heated at 1000° C. for 1 second, after which they are cooled down immediately.

The doped p-type region 3 has a depth of approximately 15 nm. The doping profile has an extreme steepness of 0.2 nm per decade. The comparatively low sheet resistance of 200 ohms/square indicates that practically all B atoms are present substitutional into the Si lattice and are accordingly electrically active.

It is especially p-channel MOSFETs manufactured by the known method which suffer much from short-channel effects owing to B tails in the source 12 and drain 13 regions caused by implantation damage. Transient-enhanced diffusion of B occurs during the activation of the dopant atoms at a comparatively high temperature, which causes the B tails. Steep source and drain junctions cannot be very well manufactured by the known method as a result of this. By contrast, the source and drain junctions manufactured by the method according to the invention have a very shallow depth, so that also the lateral diffusion is very small. This makes the influence of the source and drain on the length of the channel comparatively small. Short-channel effects are reduced by the method according to the invention. The method according to the invention is accordingly highly suitable for MOSFETs with very small channel lengths of typically 40 nm.

Alternatively, as shown in FIG. 3, the source 12 and drain 13 junctions may be provided with extensions which have a very small depth and a high degree of activation. The source and drain extensions 20, 21 are of great importance for minimizing short-channel effects such as drain-induced barrier lowering (DIBL) and punch-through. In this arrangement, the series resistances are present mainly in the source and drain extensions, while the deeper source 12 and drain 13 junctions will eventually be silicided so as to reduce the series resistance.

The very shallow source and drain extensions 20, 21 are favorable for suppressing short-channel effects, while the high degree of activation contributes to a reduction in the series resistance of the MOSFET.

Figure 3A:
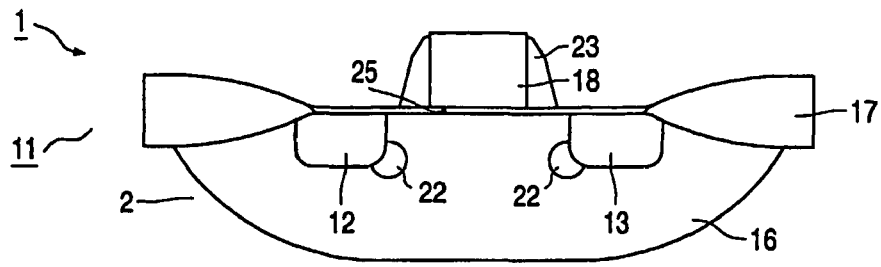
FIG. 3a is a cross-sectional view of the intermediate product in which a structure with a gate, source, and drain junctions and spacers is the starting point.

FIG. 3a starts with a MOSFET process known to those skilled in the art, with deeper source 12 and drain 13 junctions manufactured, for example, by means of ion implantation and diffusion in an RTA.

Optionally, pockets 22 may be provided by ion implantation. These pockets 22 serve to reduce the depletion regions of the source 12 and drain 13 when the transistor is in operation. The doping of the pockets is usually higher because of this and of the same type as the doping of the well (n-type in this case).

Figure 3B:
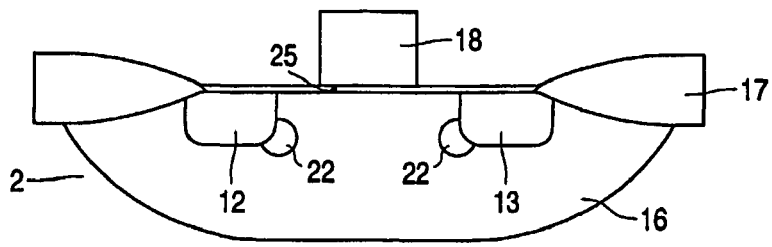
FIG. 3b is a cross-sectional view of the intermediate product in which the spacers are removed.

In FIG. 3b, the spacers 23 are removed. The spacers are made, for example, of silicon nitride and can be chemically etched with $H_3PO_4$.

Figure 3C:
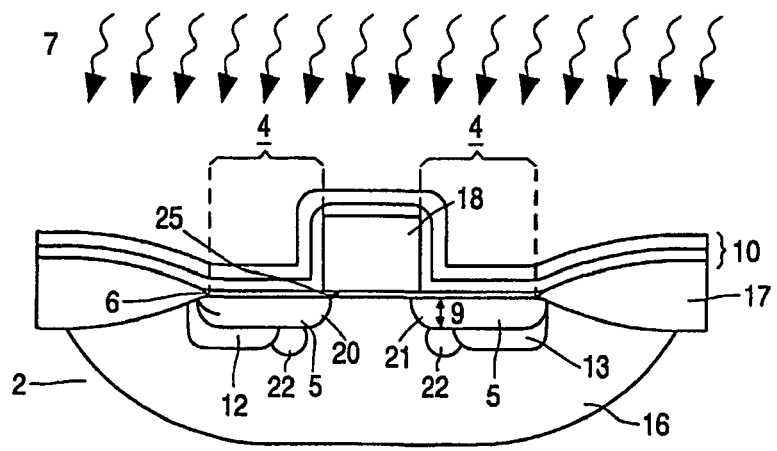
FIG. 3c is a cross-sectional view of the intermediate product in which the gate, source, and drain junctions are covered by an absorption layer, and the surface is irradiated with a radiation pulse.

In FIG. 3c, an absorption layer 10 is subsequently provided, consisting of 12 nm TEOS and a multilayer of 20 nm Ti/TiN. Then the shallow source and drain extensions 20, 21 are formed by the method according to the invention. The irradiation of the surface as described above is used. An amorphous surface layer 5 with a very small depth 9 is created thereby.

Figure 3D:
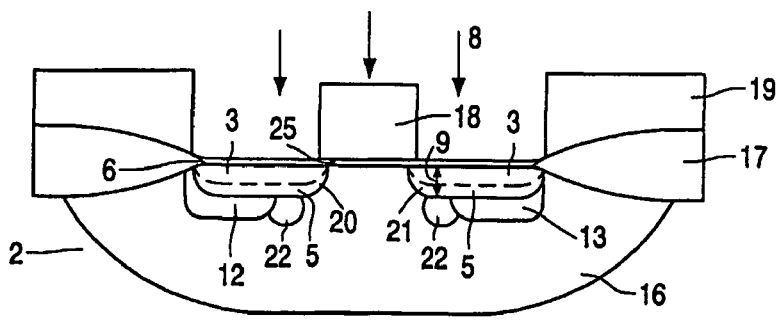
FIG. 3d is a cross-sectional view in which the source and drain junctions of the MOSFET have been formed.

The absorption layer 10 is removed, whereupon the source and drain extensions 20, 21 and the gate 18 are implanted (see FIG. 3d).

The dopant atoms are subsequently activated in the manner described above, for example by rapid thermal annealing or laser annealing.

A major advantage is that an extremely good activation of the dopant atoms is achieved in this last step, and no comparatively high-temperature steps are necessary any more in the subsequent process, which would lead to deactivation of the dopant atoms. The good activation of the dopant atoms causes the sheet resistance of the source and drain extensions and the resistance of the source and drain and polycrystalline silicon to be comparatively low. Comparatively much current flows between the source and the drain of the MOSFET manufactured in accordance with the invention as a result of this.

It is noted that the invention is not limited to the examples described above and may be used for all types of diodes, among them light-emitting diodes (LEDs), bipolar transistors, or other heterostructure bipolar transistors, memory cells such as flash, EEPROM, etc. In addition, the invention is not limited to p-type transistors and may equally well be used for n-type transistors. Neither is the method limited to silicon; it may also be used for germanium and for compounds comprising Ge and Si.

The specific dimensions and materials of the specific embodiments may be varied, as will be obvious to those skilled in the art.

What is claimed is:

1. A method of manufacturing a semiconductor device (1) with a semiconductor body (2), in which method a doped region (3) is formed in the semiconductor body (2), which semiconductor body (2) comprises a crystalline semiconducting surface region (4) of semiconductor material, while at least a portion of the crystalline semiconducting surface region (4) is amorphized so as to form an amorphous surface layer (5), characterized in that the amorphization is carried out through irradiation of the surface (6) with a radiation pulse (7) having a wavelength whereby radiation of the radiation pulse is absorbed by the crystalline surface region (4), and having energy flux whereby the crystalline surface layer (5) is melted.

2. A method as claimed in claim 1, characterized in that, after the molten portion of the crystalline semiconductor surface region (4) has solidified into an amorphous surface layer (5) owing to cooling, dopant atoms (8) are provided in the amorphous surface layer (5) by means of ion implantation.

3. A method as claimed in claim 2, characterized in that, after the provision of the dopant atoms (8), the amorphous surface layer (5) is heated to a temperature at which the dopant atoms (8) are activated.

4. A method as claimed in claim 3, characterized in that the amorphous surface layer (5) is heated by rapid thermal annealing (RTA) to below the melting temperature of the amorphous semiconductor material, whereupon the amorphous surface layer (5) recrystallizes, and the dopant atoms (8) are substitutionally incorporated into lattice sites such that said dopant atoms (8) are activated.

5. A method as claimed in claim 3, characterized in that the amorphous surface layer (5) is heated by laser annealing to above the melting temperature of the amorphous semiconductor material, and the molten surface layer (5) is subsequently cooled down to a temperature at which the molten surface layer (5) recrystallizes.

6. A method as claimed in claim 1, characterized in that the radiation pulse (7) is provided by an excimer laser.

7. A method as claimed in claim 1, characterized in that the surface layer (5) melts to a depth (9) which is set by means of the pulse duration and the energy density of the radiation pulse (7).

8. A method as claimed in claim 7, characterized in that the pulse duration of the radiation pulse (7) is shorter than 1 ns.

9. A method as claimed in claim 1, characterized in that an absorption layer (10) for the wavelength of the radiation is provided on the surface (6) before irradiation takes place.

10. A method as claimed in claim 1, wherein a MOSFET (11) is formed, characterized in that the amorphous semiconducting surface layer (5) is used for forming a source (12) or a drain (13) of the MOSFET.

11. A method as claimed in claim 5, characterized in that the concentration of electrically activated dopant atoms is higher than the solid solubility limit.

12. A semiconductor device manufactured by the method recited in claim 1, a method as claimed in any one of the preceding claims.

* * * * *